(12) United States Patent
Hollis et al.

(10) Patent No.: US 7,570,141 B2
(45) Date of Patent: Aug. 4, 2009

(54) METHOD OF DESIGNING A SHIM COIL TO REDUCE FIELD SETTLING TIME

(75) Inventors: Timothy J. Hollis, Bicester (GB);
Timothy J. Havens, Florence, SC (US);
Tomas Duby, Florence, SC (US)

(73) Assignee: General Electric Company,
Schenectady, NY (US)

( * ) Notice: Subject to any disclaimer, the term of this patent is extended or adjusted under 35 U.S.C. 154(b) by 238 days.

(21) Appl. No.: 11/275,037

(22) Filed: Dec. 5, 2005

(65) Prior Publication Data

US 2007/0126541 A1 Jun. 7, 2007

(51) Int. Cl.
*H01F 7/00* (2006.01)
*H01F 1/00* (2006.01)
*H01F 6/00* (2006.01)

(52) U.S. Cl. ..................... 335/216; 376/142
(58) Field of Classification Search ......... 335/209–306; 376/142
See application file for complete search history.

(56) References Cited

U.S. PATENT DOCUMENTS

| | | | | |
|---|---|---|---|---|
| 4,277,768 A * | 7/1981 | Burgeson et al. | ............ | 335/216 |
| 4,689,707 A * | 8/1987 | Schwall | ............ | 361/19 |
| 4,761,614 A * | 8/1988 | Prammer et al. | ............ | 324/320 |
| 4,899,109 A * | 2/1990 | Tropp et al. | ............ | 324/320 |
| 5,006,804 A * | 4/1991 | Dorri et al. | ............ | 324/320 |
| 5,045,794 A * | 9/1991 | Dorri et al. | ............ | 324/320 |
| 5,642,087 A * | 6/1997 | Crow | ............ | 335/216 |
| 5,717,371 A * | 2/1998 | Crow | ............ | 335/216 |
| 5,748,063 A * | 5/1998 | Crow | ............ | 335/299 |
| 5,760,585 A * | 6/1998 | Dorri | ............ | 324/320 |
| 6,265,960 B1 * | 7/2001 | Schauwecker et al. | ...... | 335/301 |
| 6,496,091 B2 * | 12/2002 | Schauwecker et al. | ...... | 335/216 |
| 6,563,316 B2 * | 5/2003 | Schauwecker et al. | ...... | 324/318 |
| 6,700,468 B2 * | 3/2004 | Crozier et al. | ............ | 335/299 |
| 6,816,046 B1 * | 11/2004 | Varney | ............ | 335/216 |
| 6,819,108 B2 * | 11/2004 | Huang et al. | ............ | 324/320 |
| 6,822,451 B2 * | 11/2004 | Hollis | ............ | 324/319 |
| 6,856,223 B1 * | 2/2005 | Takeshima et al. | ............ | 335/301 |
| 6,977,571 B1 * | 12/2005 | Hollis et al. | ............ | 335/216 |
| 7,098,663 B1 * | 8/2006 | Hollis | ............ | 324/320 |
| 7,148,690 B2 * | 12/2006 | Hollis | ............ | 324/320 |
| 7,199,581 B2 * | 4/2007 | Corver et al. | ............ | 324/308 |
| 7,215,123 B2 * | 5/2007 | Axel | ............ | 324/318 |
| 7,218,114 B2 * | 5/2007 | Ni et al. | ............ | 324/321 |
| 7,230,423 B2 * | 6/2007 | Deimling | ............ | 324/307 |
| 7,315,168 B2 * | 1/2008 | Rapoport et al. | ............ | 324/320 |
| 2002/0047763 A1 * | 4/2002 | Schauwecker et al. | ...... | 335/216 |
| 2004/0021465 A1 * | 2/2004 | Hollis | ............ | 324/318 |
| 2004/0066194 A1 * | 4/2004 | Slade et al. | ............ | 324/318 |
| 2005/0116712 A1 * | 6/2005 | Corver et al. | ............ | 324/309 |
| 2005/0258830 A1 * | 11/2005 | Deimling | ............ | 324/309 |
| 2006/0197531 A1 * | 9/2006 | Hollis | ............ | 324/320 |
| 2006/0208733 A1 * | 9/2006 | Hollis | ............ | 324/318 |

* cited by examiner

FOREIGN PATENT DOCUMENTS

JP 2004319798 A * 11/2004

*Primary Examiner*—Lincoln Donovan
*Assistant Examiner*—Mohamad A Musleh
(74) *Attorney, Agent, or Firm*—Ziolkowski Patent Solutions Group, SC

(57) ABSTRACT

A shim coil design technique determines a position and a geometry of a room temperature (RT) shim coil to provide both a desired field homogeneity and a desired $B_0$ field settling time. The simultaneous satisfaction of both field homogeneity and field settling time is achieved without a reduction of flux leakage from the shim coil, modification of main magnet protection circuitry, and without necessarily decoupling of the shim coil from the overall main magnet.

21 Claims, 5 Drawing Sheets

US 7,570,141 B2

METHOD OF DESIGNING A SHIM COIL TO REDUCE FIELD SETTLING TIME

BACKGROUND OF THE INVENTION

The present invention relates generally to MR systems and, more particularly, to a shim coil of a magnet assembly of an MR system that achieves a near-homogeneous magnetic field with reduced $B_0$ field settling time.

It is generally known that when a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_Z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

During fabrication and construction of the magnet assembly for an MR assembly, manufacturing tolerances and deviations in material make-up of the magnet assembly result in an inhomogeneous $B_0$ field being created by the magnet assembly absent shimming. As a result of the magnet manufacturing process, it is not uncommon for the magnet to produce a very inhomogeneous field ranging from several hundred parts per million (ppm) to several thousand ppm, and a non-accurate center magnetic field that is significantly out of range. The importance of these variations is glaringly apparent given that MR systems require an intense uniform magnetic field, typically less than 10 ppm of variations within a 40-50 cm spherical volume, but also an accurate center magnetic field value, typically less than 0.5% variation. Compounding the field inhomogeneity is that contributed by the patient itself.

Shimming is a common process that is used to remove inhomogeneities from the $B_0$ field. Shimming is important for MR systems because the average $B_0$ field strength must be within a certain window for the RF hardware of the system. A simplistic example of the effects of shimming is graphically shown in FIG. 1. As shown, a magnet assembly without shimming produces a magnet field represented by curve 2. The variations of the magnetic field are quite clear. As is widely known, these variations negatively affect data acquisition and reconstruction of an MR image. As such, it is desirable to generate a shim field, represented by curve 4, that counters or offsets the variations in the magnetic field. The combination of the shim field 4 with the magnetic field 2 yields, ideally, a homogeneous and uniform $B_0$ field represented by curve 6.

The shimming process includes the precise placement of shim elements within the magnetic assembly such that numerous small magnetic fields are generated to offset variations in the $B_0$ field. The shim elements include active shims such as shim coils or permanent magnets as well as passive shims such as iron pieces. Shim coils are common in superconducting magnet assemblies and their shimming may be controlled by regulating current thereto. Course adjustments in field homogeneity for superconducting magnets are usually made with superconducting shim coils located within the helium vessel. Fine adjustments are more commonly achieved through one or more room temperature (RT) shim coils connected to a high-stability multi-channel power supply. Adjustments to the RT shim coils cause a reaction in the main superconducting magnet and any supplementary superconducting coils as they attempt to conserve flux according to Lenz' law. Furthermore, in order to improve its quench robustness, the main coil (magnet) is often divided into multiple sections where each section is protected with its own dump resistor. The magnet sections initially react independently to the RT shim adjustment and the resulting unmatched currents cause a temporary flow of current through the dump resistors. The current flow subsequently decays from the resistors, resulting in an undesirable field settling effect.

Notwithstanding the undesirable impact on settling time, conventional shim coils are constructed without regard to the affects the shims have on the $B_0$ field settling time. That is, the primary objective is to construct the shim coil to improve field homogeneity. As a result, it is not uncommon for a given shimmed magnet to have a field settling time on the order of minutes. This settling time necessarily increases scan time and negatively affects throughput. More specifically, once the MR scanner is powered, scanning cannot commence until after the $B_0$ field has settled and observing several minutes for that field to settle can significantly increase scan time.

It would therefore be desirable to have shim coil that is constructed with the impact on field settling time considered.

BRIEF DESCRIPTION OF THE INVENTION

The present invention provides a shim coil for the magnet assembly of an MR scanner that overcomes the aforementioned drawbacks. The shim coil is constructed to have an appropriate shim coil geometry, e.g., number of turns, and an appropriate shim coil position that results in both a desired field homogeneity and a desired $B_0$ field settling time. In this regard, the impact on field settling time is considered when designing and constructing the shim coil. Moreover, this simultaneous satisfaction of both field homogeneity and field settling time is achieved without a reduction of flux leakage from the shim coil, modification of main magnet protection circuitry, and without necessarily decoupling the shim coil from the overall main magnet.

Therefore, in accordance with one aspect of the invention, a method of designing a shim magnet for a $B_0$ magnet assembly is presented. The method includes the steps of determining a field homogeneity variance for a given magnet assembly having a default $B_0$ field settling time and determining a desired $B_0$ field settling time different from the default $B_0$ field settling time for the given magnet assembly. The method further includes the step of selecting at least one of shim coil position relative to the magnet assembly and a number of shim coil turns for a shim coil to be used for shimming the given magnet that will result in both the desired $B_0$ field settling time and a field inhomogeneity that compensates for the field homogeneity variance.

In accordance with another aspect of the invention, the invention is embodied in a computer program stored on a computer readable storage medium and having instructions which, when executed by a computer, cause the computer to model time dependence of a $B_0$ field generated by a magnet assembly as $B_0(t)=A_0+A_1 e^{-t/\tau_1}+A_2 e^{-t/\tau_2}+\ldots+A_n e^{-t/\tau_n}$, where $A_0$ is a settled value of the $B_0$ field, $\tau_i$ is the $i^{th}$ settling time constant, $1 \leq i \leq n$, and $A_i$ is the amplitude of the $i^{th}$ exponential settling term. The computer is further caused to identify settling terms, $A_i e^{-t/\tau_i}$, having similar time constants, $\tau$, and determine amplitudes, $A_i$, of the identified settling terms that will result in those amplitudes being balanced to reduce $B_0$ field settling time of the magnet assembly. Alternately, the computer may determine the amplitudes that will result in a reduction in the time constants.

According to another aspect, the present invention is embodied in a magnetic resonance (MR) scanner. The scanner includes a magnet designed to impress a polarizing magnet field. The magnet has a main superconducting coil designed to generate a $B_0$ field and a superconducting shim coil inductively coupled to the main superconducting coil to improve homogeneity of the $B_0$ field. The magnet also has an RT shim coil, inductively coupled to both the main superconducting coil and the superconducting shim coil, to improve homogeneity of the $B_0$ field. The position and the geometry of the RT shim coil are selected such that the $B_0$ field has both a desired homogeneity and a desired field settling time.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
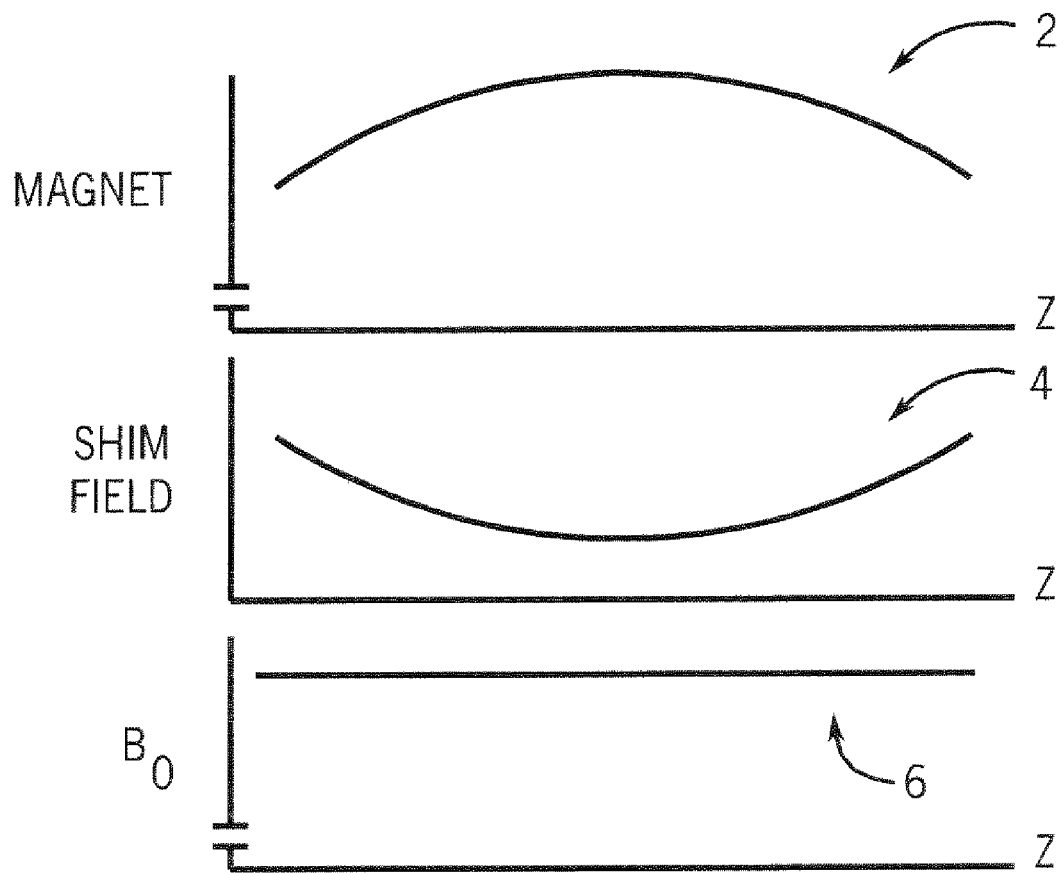
FIG. 1 is a series of curves illustrating a magnetic field generated by a magnet assembly, a shim field generated by shim elements incorporated into a magnet assembly, and a uniform $B_0$ field that is desired when the magnetic field is combined with the shim field.
Figure 2:
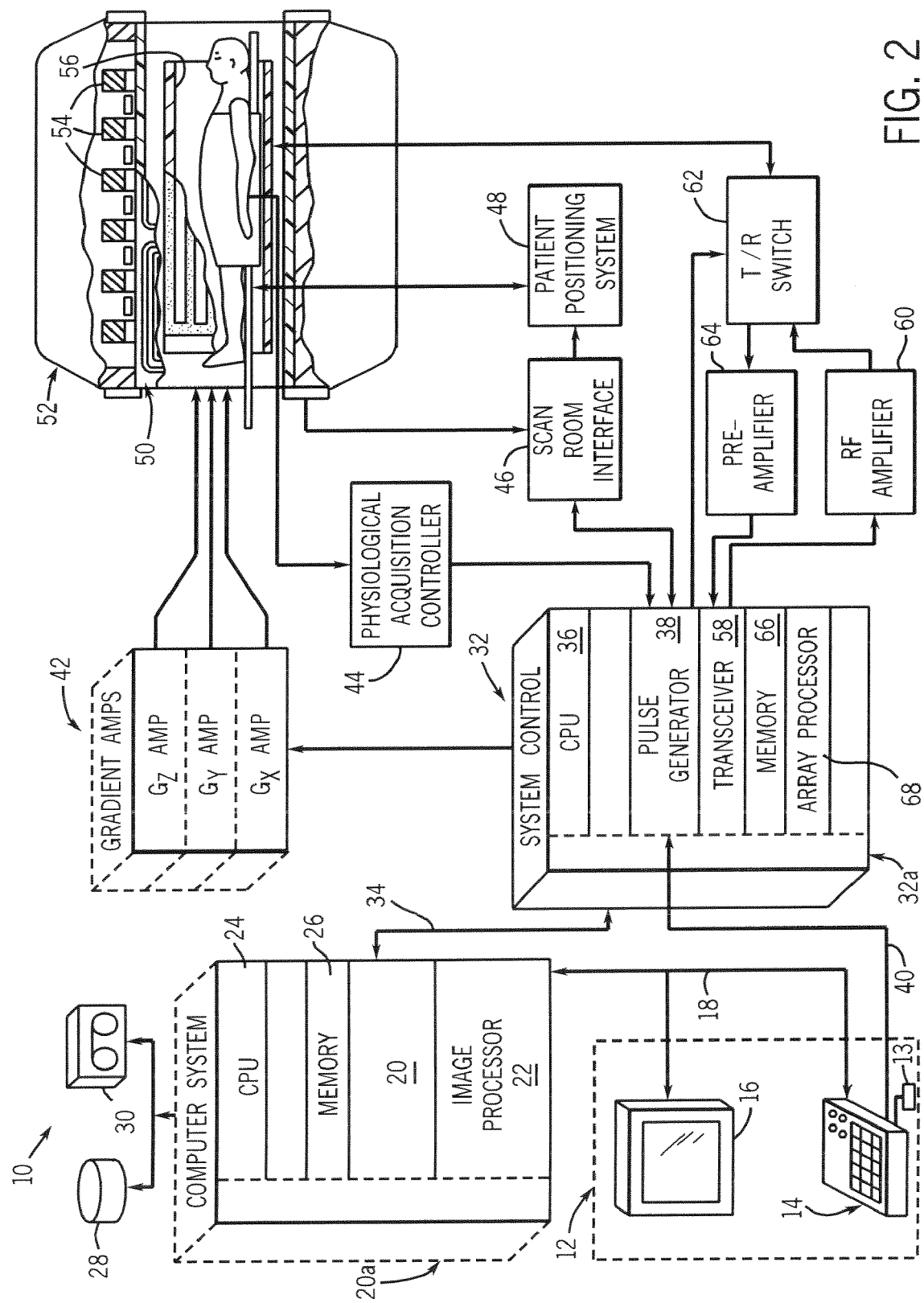
FIG. 2 is a schematic block diagram of an MR imaging system for use with the present invention.

Referring to FIG. 2, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet assembly 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The present invention will be described to method of designing a shim coil used for shimming the magnet assembly of an MR imaging system, such as that described with respect to FIG. 2. While the invention will be described as a series of steps carried out by a process or technique, the invention may be equivalently carried out by one or more computers or processors in accordance with executable instructions of a computer program. Additionally, the present invention will be described relative to designing a shim coil for shimming a superconducting magnet, but the invention is equivalently applicable with designing shims for other magnet types including, but not limited to permanent magnets. A shim coil that may be used to shim multiple types of magnets is also contemplated.

Figure 3:
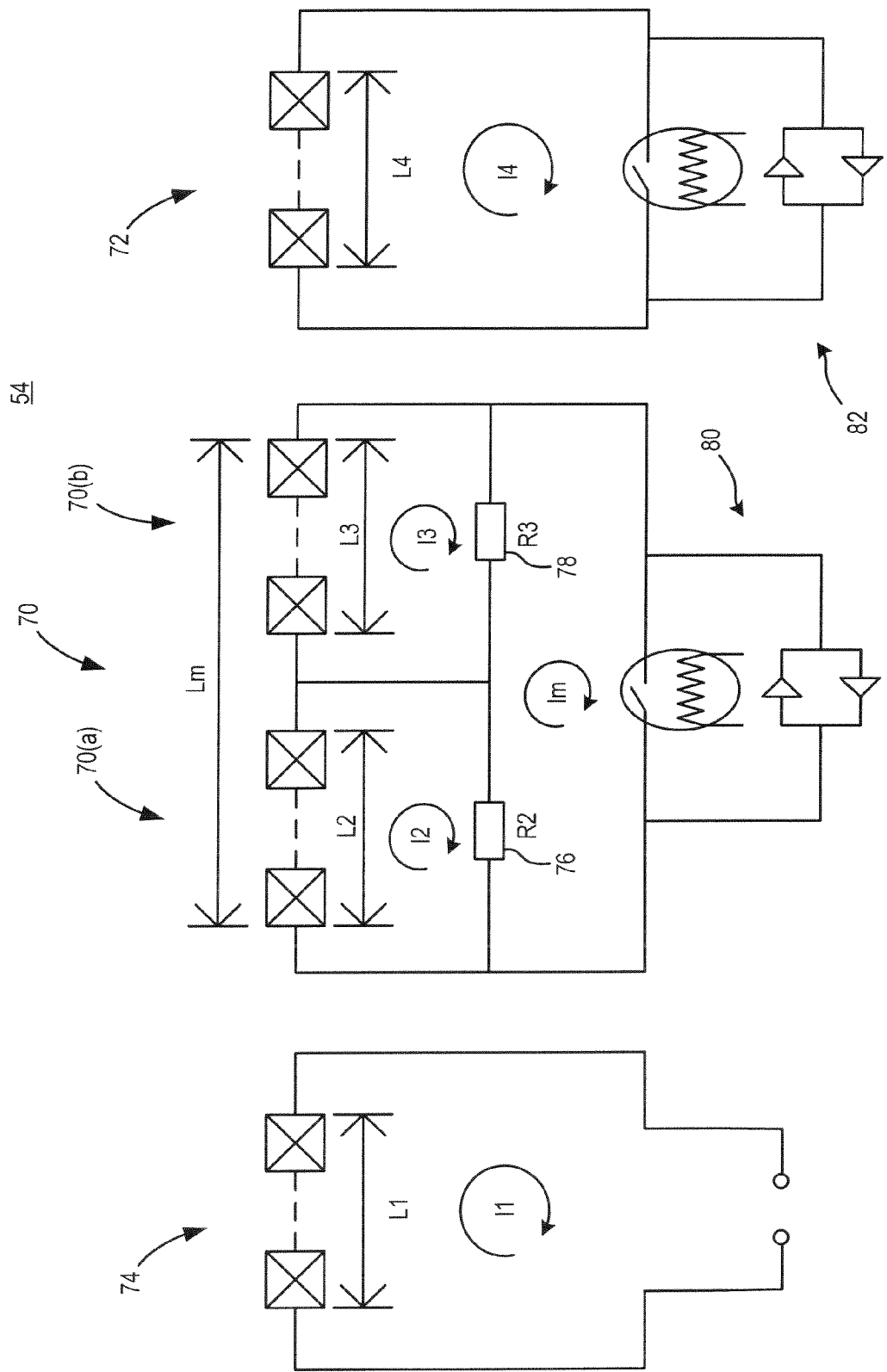
FIG. 3 is a circuit diagram of a magnet assembly having a RT shim coil, a main superconducting magnet, and a superconducting shim coil.

Referring now to FIG. 3, an exemplary construction of a polarizing magnet assembly 54 is schematically illustrated in a circuit diagram. In accordance with well-known construction, the magnet assembly 54 includes a main superconducting magnet 70 having multiple sections 70(a) and 70(b), each section containing one or more coils. The polarizing magnet assembly 54 also includes a superconducting shim coil 72 as well as a RT shim coil 74. Superconducting magnet 70 includes a pair of protection resistors 76, 78, one resistor across each section. The superconducting magnet 70 as well as the superconducting shim coil includes diode-protected switches 80, 82 that selectively energize the magnet 70 and the shim coil 72.

As indicative above, the simplified circuit diagram of FIG. 3 illustrates a well-known construction for the magnet assembly of an MR scanner. In this regard, if the RT shim coil 74 is not properly positioned and is not of the appropriate geometry, the resulting field settling time for the magnet assembly can be prohibitively long, e.g., of the order of several minutes. Specifically, for an instantaneous change of RT shim current by $\Delta I_1$ the currents in the superconducting magnet, sections 70(a) and 70(b), and superconducting shim coil section 72, change according to the following equations that are derived by applying Maxwell loop equations:

$$L_1 \frac{dI_1}{dt} + M_{12} \frac{dI_2}{dt} + M_{13} \frac{dI_3}{dt} + M_{14} \frac{dI_4}{dt} = V_1, \quad \text{(Eqn. 1)}$$

$$M_{12} \frac{dI_1}{dt} + L_2 \frac{dI_2}{dt} + M_{23} \frac{dI_3}{dt} + M_{24} \frac{dI_4}{dt} + (I_2 - I_m)R_2 = 0, \quad \text{(Eqn. 2)}$$

$$M_{13} \frac{dI_1}{dt} + M_{23} \frac{dI_2}{dt} + L_3 \frac{dI_3}{dt} + M_{34} \frac{dI_4}{dt} + (I_3 - I_m)R_3 = 0, \quad \text{(Eqn. 3)}$$

$$M_{14} \frac{dI_1}{dt} + M_{24} \frac{dI_2}{dt} + M_{34} \frac{dI_3}{dt} + L_4 \frac{dI_4}{dt} = 0 \text{ and} \quad \text{(Eqn. 4)}$$

$$(I_m - I_2)R_2 + (I_m - I_3)R_3 = 0. \quad \text{(Eqn. 5)}$$

In this set of linear differential equations currents $I_2$, $I_3$, $I_4$ and $I_m$ are unknown. It can be shown that the solution for these currents is:

$$I_i(t) = S_{i0} + S_{i1}e^{-t/\tau_1} + S_{i2}e^{-t/\tau_2} + S_{i3}e^{-t/\tau_3}, \; i=2, 3, 4, m \quad \text{(Eqn.6),}$$

where $\tau_1$, $\tau_2$ and $\tau_3$ are time constants characteristic for the magnet protection circuit. It is contemplated that more or less than three time constants may be used to characterize the magnet protection circuit. Constants $S_{ij}$ are determined by the initial conditions in FIG. 3. Each of these currents contributes to the $B_0$ field. This can be mathematically expressed as:

$$B_0 = T_2I_2 + T_3I_3 + T_4I_4 \quad \text{(Eqn.7),}$$

where $T_i$ are some constants describing the contribution of currents $I_2$, $I_3$ and $I_4$ to the $B_0$ field. Since the currents $I_2$, $I_3$, $I_4$ and $I_m$ are time dependent, so will the $B_0$ field be time dependent with the same time constants $\tau_1$, $\tau_2$ and $\tau_3$:

$$B_0(t) = A_0 + A_1e^{-t/\tau_1} + A_2e^{-t/\tau_2} + A_3e^{-t/\tau_3} \quad \text{(Eqn.8),}$$

where $A_0$ is a settled value of the $B_0$ field, $\tau_i$ is the $i^{th}$ settling time constant, $1 \leq i \leq 3$, and $A_i$ is the amplitude of the $i^{th}$ exponential settling term.

One skilled in the art will appreciate that the time constants $\tau_i$ are an intrinsic property of the magnet assembly 70 and, thus, cannot be influenced by adjusting the position and/or geometry of the RT shim coil 74. However, varying the shim coil geometry and/or shim coil position will change the amplitudes of the exponential settling terms. Therefore, in accordance with one aspect of the present invention, a shim coil geometry and/or shim coil position is selected to minimize the amplitudes of the exponential settling terms. By doing so, the field settling time is reduced. While it is desirable to minimize the amplitude of all the exponential settling terms, it has been shown that minimizing the amplitudes of those settling terms having longer time constants is particularly effective in reducing field settling time, e.g., 50 seconds. Alternately, field settling time can be reduced by balancing the amplitudes of the exponential settling terms having similar time constants. In either case, during design of the shim coil, the polarizing magnet 54 is modeled according to Eqn. 8 and from that model, appropriate shim coil position and/or shim coil geometry, e.g., number of turns, is determined.

Figure 4:
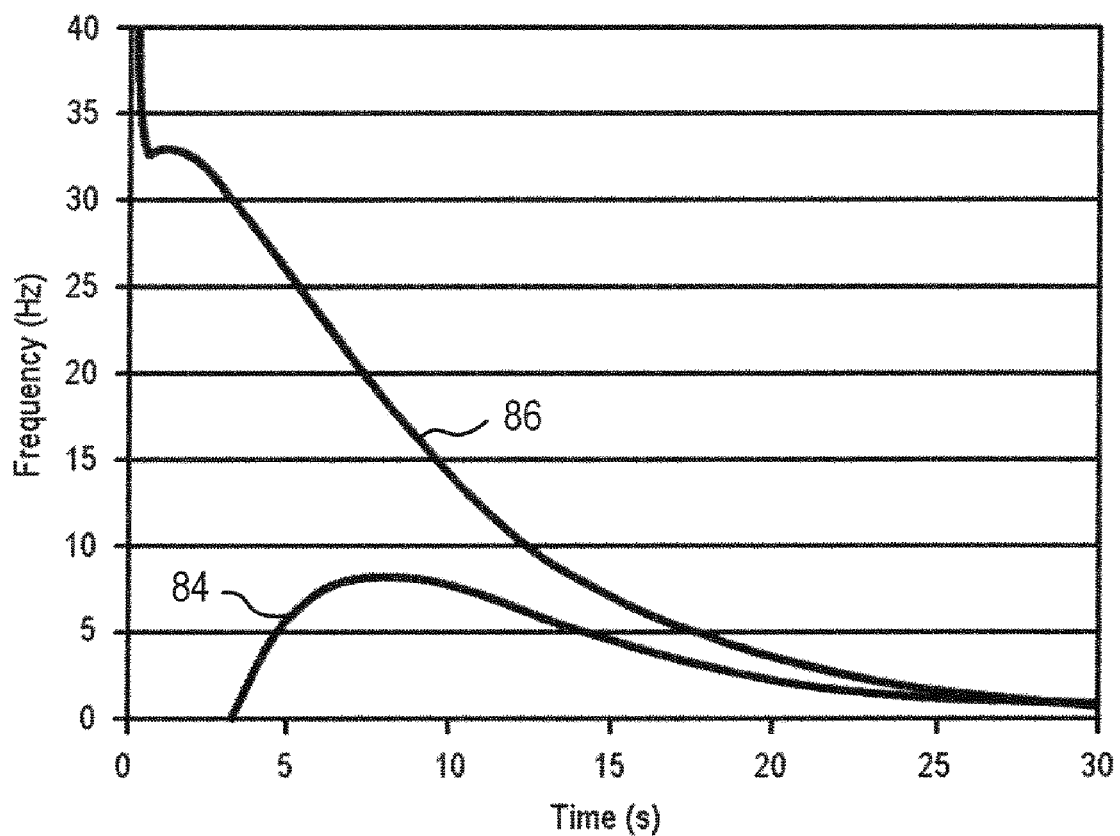
FIG. 4 is a graph illustrating settling advantageous of an exemplary shim coil designed according to the presented invention relative to a conventionally designed shim coil.

To determine the B0 field, a sample of hydrogen protons is subjected to the field, which causes polarization of the nuclear spins. The spins are then excited with radio frequency (RF) radiation, and, as they relax, they emit weak radio frequency radiation. The frequency of this radiation is proportional to the magnetic field to which they are subjected. Referring now to FIG. 4, the settling advantages achieved with the present invention are shown for an exemplary shim coil, whose position and geometry are determined according to the present invention, than for a conventionally designed shim coil. As shown for a 1 Ampere change in RT shim current, the B0 field settling time 84 is much less for the shim coil designed according to the present invention than for the conventionally designed shim coil 86. One skilled in the art will appreciate the exemplary shim coil designed in accordance with the present invention that is modeled in the graph of FIG. 4 illustrates one particular coil and that other coils whose operation depart from the curve in FIG. 4 are possible. That is, depending on other performance and cost parameters, different coil optimizations are possible. For example, by designing a coil to be specific for a certain type of magnet, reduced settling times beyond those shown in FIG. 4 are possible; however, in a preferred embodiment, a shim coil is generally constructed such that its geometry may be accommodated to shim multiple types of magnets. For optimal performance on a variety of magnet types, it is contemplated that through conventional switch and control, fewer than all the turns of a shim coil may be included in the shim circuit depending upon the type of magnet to be shimmed.

Figure 5:
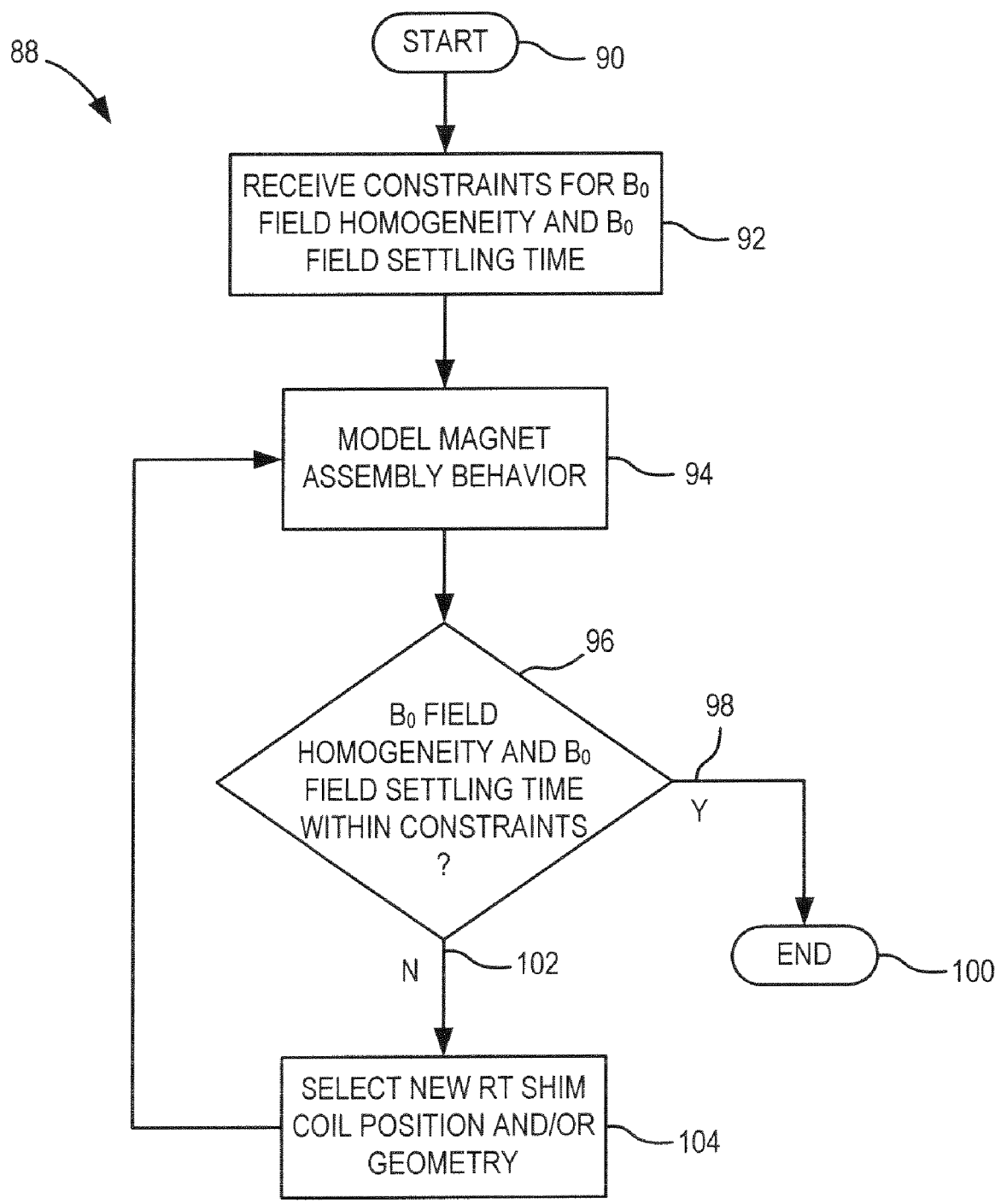
FIG. 5 is a flow chart setting forth the steps of a shim coil design technique according to the present invention.

Referring now to FIG. 5, a flow chart setting forth the steps of a shim coil design technique 88 according to the present invention will be described. Technique 88 is preferably embodied in computer executable code that may be executed by a computer processor. The technique begins at 90 whereupon constraints with respect to field homogeneity and $B_0$ field settling time are received at 92. The constraints are preferably user-input variables, but it is contemplated that the constraints may be recalled from memory. For example, the appropriate constraints may be recalled from a database based on a user input identifying the type of superconducting shim coil and magnet to be shimmed.

Utilizing Eqn. 8, operation of the magnet assembly with default shimming is modeled at 94. In this regard, the technique queries at step 96 whether the field homogeneity and $B_0$ field settling time with the default shimming fell within the proscribed constraints 96. If so 96, 98, the process ends at 100 with shimming of the magnet assembly taking place in accordance with default position and geometry standards. However, as the particulars of each magnet assembly vary between magnet assemblies, it is unlikely that the default position and geometry standards will result in both satisfaction of field homogeneity and $B_0$ field settling time constraints. Thus, it is more likely that the at least one of field homogeneity and $B_0$ field settling time will fall outside the constraints. If so 96, 102, the technique proceeds to step 104 with selection of a new shim coil position and/or geometry 104. In this regard, a shim coil position and/or geometry is determined that will result in a reduction or, alternately, a balancing of the amplitudes of the exponential settling terms of Eqn. 8. With the new shim coil position and/or geometry, the technique loops back to step 94 with modeling of magnet assembly behavior. In this regard, steps 94-104 are reiterated until both field homogeneity and $B_0$ field settling time have been satisfied.

While technique 88 may be physically implemented, through the iteratively placement and/or reconfiguring of the shim coils followed by measurement of field homogeneity and $B_0$ field settling time, it is preferred that technique 88 be reiteratively carried out through a simulated implementation. In this regard, technique 88 provides a design tool for determining the appropriate position and/or geometry for shim coils of a magnet assembly. Those results can then be physically verified through actual placement and/or configuring, followed by measuring the field homogeneity and settling time. The above shimming technique is effective in determining an appropriate shim coil geometry, e.g., number of turns, and an appropriate shim coil position that results in both a desired $B_0$ field homogeneity and a desired $B_0$ field settling time. In this regard, shim coil design is cognizant of the impact on field settling time when determining the type, geometry, and location of the shim coil(s). Moreover, this simultaneous satisfaction of both field homogeneity and field settling time is achieved without a reduction of flux leakage from the shim coil, modification of main magnet protection circuitry, and without necessarily decoupling of the shim coil from the overall main superconducting magnet. In addition to reducing scan time, the present invention avoids the need to have shielded shim coils thereby saving radial space in the magnet assembly. In one exemplary magnet assembly, settling time was reduced to approximately 10 seconds.

Further, the present invention is not limited to tailoring an RT shim coil to a specific magnet type. It is contemplated that the present invention may be used to design an RT shim coil that would comprise the settling characteristics of several magnet types but, if preferred, be optimized for a specific magnet type. It also contemplated that an RT shim coil can be constructed with turns that can be selectively included/excluded in the shim circuit. In this regard, fewer than all of the turns of the shim coil may be used for shimming depending upon the particular shimming required for a given magnet, or magnet type.

Therefore, a method of designing a shim coil is presented. The method includes the steps of determining a field homogeneity variance for a given magnet assembly having a default $B_0$ field settling time and determining a desired $B_0$ field settling time different from the default $B_0$ field settling time for the given magnet assembly. The method further includes the step of selecting at least one of shim coil position relative to the magnet assembly and a number of shim coil turns for a shim coil to be used for shimming the given magnet that will result in both the desired $B_0$ field settling time and a field inhomogeneity that compensates for the field homogeneity variance.

The invention is also embodied in a computer program stored on a computer readable storage medium and having instructions which, when executed by a computer, cause the computer to model time dependence of a $B_0$ field generated by a magnet assembly as $B_0(t)=A_0+A_1 e^{-t/\tau_1}+A_2 e^{-t/\tau_2}+ \ldots +A_n e^{-t/\tau_n}$, where $A_0$ is a settled value of the $B_0$ field, $\tau_i$ is the $i^{th}$ settling time constant $1 \leq i \leq n$, and $A_i$ is the amplitude of the $i^{th}$ exponential settling term. The computer is further caused to identify settling terms, $A_i e^{-t/\tau_i}$, having similar time constants, $\tau$ and determine amplitudes, $A_i$, of the identified settling terms that will result in those amplitudes being balanced to reduce $B_0$ field settling time of the magnet assembly.

The present invention is also embodied in an MR scanner. The scanner includes a magnet designed to impress a polarizing magnet field. The magnet has a main superconducting coil designed to generate a magnetic field and a superconducting shim coil inductively coupled to the main superconducting coil to improve homogeneity of the magnetic field. The magnet also has an RT shim coil inductively coupled to the main superconducting coil and the superconducting shim coil to improve homogeneity of the field. The position and the geometry of the RT shim coil are selected such that the field has both a desired homogeneity and a desired field settling time.

The present invention has been described in terms of the preferred embodiment, and it is recognized that equivalents, alternatives, and modifications, aside from those expressly stated, are possible and within the scope of the appending claims.

What is claimed is:

1. A method of designing a shim coil comprising the steps of:
    determining a field homogeneity variance for a magnet assembly having a default B0 field settling time;
    determining a desired B0 field settling time different from the default B0 field settling time for the magnet assembly; and
    selecting at least one of a shim coil position relative to the magnet assembly and a number of shim coil turns for a shim coil to be used for shimming the magnet assembly that balances both the desired B0 field settling time and a field homogeneity to compensate for the field homogeneity variance.

2. The method of claim 1 further comprising the step of selecting both the shim coil position and the number of turns for the shim coil to be used for shimming the magnet assembly.

3. The method of claim 1 further comprising the steps of shimming the magnet assembly with the shim coil and measuring homogeneity of a field generated with the shimmed magnet assembly, and repeating the steps of selecting, shimming, and measuring until the desired B0 field settling time and the field homogeneity that compensates for the field homogeneity variance is measured.

4. The method of claim 1 wherein the magnet assembly is a superconducting magnet assembly having a superconducting shim coil.

5. The method of claim 4 wherein the shim coil is a room temperature (RT) shim coil.

6. The method of claim 1 wherein the step of selecting includes:
modeling time dependence of a B0 field generated by the magnet assembly as $B0(t)=A0+A1e-t/\tau 1+A2e-t/\tau 2+\ldots +Ane-t/\tau n$, where A0 is a settled value of the B0 field, $\tau i$ is the ith settling time constant, $1\leq i\leq n$ and Ai is the amplitude of the ith exponential settling term;
identifying settling terms, $Aie-t/\tau i$, having similar time constants, $\tau$; and
determining amplitudes, Ai, of the identified settling terms that will result in those amplitudes being balanced to reduce a resultant B0 field settling time of the magnet assembly.

7. The method of claim 1 further comprising the step of achieving the desired B0 field settling time and the field homogeneity that compensates for the field homogeneity variance without modification of a magnet protection circuit.

8. The method of claim 1 wherein the desired B0 field settling time is approximately 20 seconds.

9. The method of claim 1 further comprising the step of selecting the at least one of shim coil position relative to the magnet assembly and the number of shim coil turns for the shim coil to be used for shimming the magnet assembly that reduces mutual inductance between the shim coil and the magnet assembly.

10. The method of claim 1 wherein the magnet assembly is constructed to impress a polarizing magnetic field about an object from which data is acquired by a magnetic resonance scanner.

11. A computer readable storage medium having a computer program stored thereon and representing a set of instructions that when executed by a computer causes the computer to:
model time dependence of a no field generated by a magnet assembly as $B0(t)=A0+A1e-t/\tau 1+A2e-t/\tau 2+\ldots +Ane-t/\tau n$, where A0 is a settled value of the B0 field, $\tau i$ is the ith settling time constant, $1\leq i\leq n$ and Ai is the amplitude of the ith exponential settling term;
identify settling terms, $Aie-t/\tau i$, having similar time constants, $\tau$; and
determine amplitudes, Ai, of the identified settling terms that will result in those amplitudes being balanced to reduce a B0 field settling time of the magnet assembly.

12. The computer readable storage medium of claim 11 wherein the computer is further caused to select amplitude of the identified settling terms that will result in both a desired field settling time and a desired field near-homogeneity.

13. The computer readable storage medium of claim 11 wherein the computer is further caused to determine at least one of shim coil location and shim coil turn number from the determined amplitudes.

14. The computer readable storage medium of claim 13 wherein the magnet assembly includes a superconducting main magnet and a superconducting shim magnet and wherein the shim coil is a room temperature (RT) shim coil.

15. The computer readable storage medium of claim 11 wherein the computer is further caused to determine the amplitudes that will result in a reduction in the time constants.

16. A magnetic resonance (MR) scanner comprising a magnet designed to impress a polarizing magnet field, the magnet having:
a main superconducting coil designed to generate a magnetic field;
a superconducting shim coil inductively coupled to the main superconducting coil to improve homogeneity of the field; and
a room temperature (RT) shim coil inductively coupled to the main superconducting coil and the superconducting shim coil to improve homogeneity of the field, wherein a position and a geometry for the RT shim coil are selected to balance both a field homogeneity and a desired B0 field settling time to compensate for a field homogeneity variance.

17. The MR scanner of claim 16 wherein the position and the geometry for the RT shim coil is determined by:
modeling time dependence of a B0 field generated by the main superconducting coil, the superconducting shim coil, and the RT shim coil as $B0(t)=A0+A1e-t/\tau 1+A2e-t/\tau 2+\ldots +Ane-t/\tau n$, where A0 is a settled value of the B0 field, $\tau$ is the ith settling time constant, $1\leq i\leq n$, and Ai is the amplitude of the ith exponential settling term; and
selecting a position and a geometry of the RT shim coil that results in a minimizing of the amplitudes Ai.

18. The MR scanner of claim 17 wherein the position and geometry for the RT shim coil is determined by identifying amplitudes Ai with longer time constants and selecting the position and the geometry that results in the minimizing of the amplitudes Ai corresponding to those longer time constants.

19. The MR scanner of claim 16 wherein the position and the geometry for the RT shim coil is determined by:
modeling time dependence of a magnetic field generated by the main superconducting coil, the superconducting shim coil, and the RT shim coil as $B0(t)=A0+A1e-t/\tau 1+A2e-t/\tau 2+\ldots +Ane-t/\tau n$, where A0 is a settled value of the B0 field, $\tau$ is the ith settling time constant, $1\leq i\leq n$, and Ai is the amplitude of the ith exponential settling term;
identifying settling terms, $Aie-t/\tau i$, having similar time constants, $\tau$; and
selecting the position and the geometry of the RT shim coil that results in amplitudes, Ai, of the identified settling terms being balanced.

20. The scanner of claim 16 wherein the geometry of the RT shim coil corresponds to a number of turns of the RT shim coil.

21. The MR scanner of claim 16 wherein the RT shim coil is capable of shimming multiple types of magnets and includes a number of turns that may be used for shimming, and wherein the geometry of the RT shim coil is selected such that fewer than all of the number of turns are used for shimming.

* * * * *

UNITED STATES PATENT AND TRADEMARK OFFICE
CERTIFICATE OF CORRECTION

PATENT NO. : 7,570,141 B2  Page 1 of 1
APPLICATION NO. : 11/275037
DATED : August 4, 2009
INVENTOR(S) : Hollis et al.

It is certified that error appears in the above-identified patent and that said Letters Patent is hereby corrected as shown below:

Col. 9, line 36 (Claim 11), delete "no" and substitute therefore -- B0 --;
　　　line 39 (Claim 11), delete "and Ai is" and substitute therefore -- , and Ai is --.

Signed and Sealed this

Sixth Day of October, 2009

David J. Kappos
*Director of the United States Patent and Trademark Office*